(12) United States Patent
Muratsuchi

(10) Patent No.: US 10,180,677 B2
(45) Date of Patent: Jan. 15, 2019

(54) SUBSTRATE STOPPING POSITION DETERMINATION METHOD AND SUBSTRATE STOPPING POSITION DETERMINATION DEVICE

(71) Applicant: FUJI CORPORATION, Chiryu (JP)

(72) Inventor: Hiroaki Muratsuchi, Hashima-gun (JP)

(73) Assignee: FUJI CORPORATION, Chiryu (JP)

( * ) Notice: Subject to any disclaimer, the term of this patent is extended or adjusted under 35 U.S.C. 154(b) by 69 days.

(21) Appl. No.: 14/903,221

(22) PCT Filed: Jul. 8, 2013

(86) PCT No.: PCT/JP2013/068684
§ 371 (c)(1),
(2) Date: Jan. 6, 2016

(87) PCT Pub. No.: WO2015/004721
PCT Pub. Date: Jan. 15, 2015

(65) Prior Publication Data
US 2016/0154401 A1    Jun. 2, 2016

(51) Int. Cl.
*G05B 19/402*    (2006.01)
*H05K 13/08*    (2006.01)

(52) U.S. Cl.
CPC .......... *G05B 19/402* (2013.01); *H05K 13/08* (2013.01); *G05B 2219/35162* (2013.01); *G05B 2219/45031* (2013.01)

(58) Field of Classification Search
CPC .................................................. G05B 19/402
See application file for complete search history.

(56) References Cited

U.S. PATENT DOCUMENTS 7,077,262 B2    7/2006    Kabeshita et al.
7,219,787 B2    5/2007    Kabeshita et al.
(Continued)

FOREIGN PATENT DOCUMENTS

JP    2002-111298 A    4/2002
JP    2003-243890 A    8/2003
(Continued)

OTHER PUBLICATIONS

Extended Search Report dated Feb. 13, 2017 in European Patent Application No. 13888915.9.
(Continued)

*Primary Examiner* — Tejal Gami
(74) *Attorney, Agent, or Firm* — Oblon, McClelland, Maier & Neustadt, L.L.P.

(57) ABSTRACT

A substrate stopping position determination method of an electronic component mounting machine, is provided with a movement time calculation step of calculating movement times in which two mounting heads move in order to mount electronic components when a first substrate is positioned in a first side and a second substrate is positioned in a second side, an interference loss time calculation step of calculating an interference loss time in which, while one of the two mounting heads enters an interference area, the other waits to enter the interference area, and a stopping position determination step of determining the first and the second side set position which are selected from among all combinations as substrate stopping positions based on total movement times which are calculated for all of the combinations of the first and the second side set position and the interference loss time.

8 Claims, 11 Drawing Sheets

(56) References Cited

U.S. PATENT DOCUMENTS

| 2004/0128827 A1 | 7/2004 | Shimizu et al. |
| 2009/0100672 A1 | 4/2009 | Sumi et al. |
| 2010/0050426 A1 | 3/2010 | Shimizu et al. |
| 2012/0227255 A1 | 9/2012 | Shimizu et al. |
| 2013/0212876 A1 | 8/2013 | Shimizu et al. |

FOREIGN PATENT DOCUMENTS

| JP | 2004-172500 A | 6/2004 |
| JP | 2005-150387 A | 6/2005 |
| JP | 2005-167220 A | 6/2005 |
| JP | 4523217 B2 | 8/2010 |

OTHER PUBLICATIONS

International Search Report dated Sep. 10, 2013 in PCT/JP2013/068684 filed Jul. 8, 2013.

FIG. 11

TOTAL MOVEMENT TIME

| | | FIRST SIDE SET POSITION | | |
|---|---|---|---|---|
| | | P1a (FRONT POSITION) | P1c (INTERMEDIATE POSITION) | P1b (ENDMOST POSITION) |
| SECOND SIDE SET POSITION | P2a (FRONT POSITION) | 20 SECONDS | 27 SECONDS | 35 SECONDS |
| | P2c (INTERMEDIATE POSITION) | 28 SECONDS | 30 SECONDS | 38 SECONDS |
| | P2b (ENDMOST POSITION) | 34 SECONDS | 37 SECONDS | 40 SECONDS |

INTERFERENCE LOSS TIME

| | | FIRST SIDE SET POSITION | | |
|---|---|---|---|---|
| | | P1a (FRONT POSITION) | P1c (INTERMEDIATE POSITION) | P1b (ENDMOST POSITION) |
| SECOND SIDE SET POSITION | P2a (FRONT POSITION) | 20 SECONDS | 12 SECONDS | 8 SECONDS |
| | P2c (INTERMEDIATE POSITION) | 12 SECONDS | 5 SECONDS | 4 SECONDS |
| | P2b (ENDMOST POSITION) | 8 SECONDS | 4 SECONDS | 2 SECONDS |

FIG. 14

|  | First Mounting Head | Second Mounting Head | TOTAL |
|---|---|---|---|
| FIRST SUBDIVISION AREA | 2 SECONDS | 3 SECONDS | 5 SECONDS |
| SECOND SUBDIVISION AREA | 3 SECONDS | 1 SECONDS | 4 SECONDS |
| THIRD SUBDIVISION AREA | 2 SECONDS | 2 SECONDS | 4 SECONDS |
| FOURTH SUBDIVISION AREA | 4 SECONDS | 2 SECONDS | 6 SECONDS |

FIG. 15

|  | First Mounting Head | Second Mounting Head | TOTAL |
|---|---|---|---|
| FIRST SUBDIVISION AREA | 2 SECONDS | 2 SECONDS | 4 SECONDS |
| SECOND SUBDIVISION AREA | 1 SECONDS | 1 SECONDS | 2 SECONDS |
| THIRD SUBDIVISION AREA | 1 SECONDS | 2 SECONDS | 3 SECONDS |

SUBSTRATE STOPPING POSITION DETERMINATION METHOD AND SUBSTRATE STOPPING POSITION DETERMINATION DEVICE

TECHNICAL FIELD

The present invention relates to a substrate stopping position determination method and a substrate stopping position determination device in an electronic component mounting machine.

BACKGROUND ART

A device which is described in PTL 1 is known as a type of the electronic component mounting machine. As illustrated in FIG. 1 of PTL 1, in order to convey each of first and second substrates 2-1 and 2-2 along a conveyance direction and mount electronic components thereon, the electronic component mounting machine is provided with first and second substrate conveyance lanes 3 and 13 which cause the first and second substrates 2-1 and 2-2 to stop at respective predetermined substrate stopping positions, and first and second mounting heads 4 and 14 which respectively mount the electronic components of first and second component supplying devices 8A and 18A (8B and 18B) to the first and second substrates 2-1 and 2-2 which are stopped in the respective predetermined substrate stopping positions.

CITATION LIST

Patent Literature

PTL 1: Japanese Patent No. 4523217

SUMMARY

Technical Problem

In the electronic component mounting machine which is described in PTL 1 described above, there is a concern that the two mounting heads 4 and 14 which mount the electronic components will interfere with each other, and, in order to avoid this interference, it is conceivable to distance the stopping positions (the mounting positions) of the two substrates 2-1 and 2-2. At this time, when the stopping positions are distanced, there is a concern that, since the movement distance of the mounting heads is increased, the movement time, and thus, the production time will be increased. Meanwhile, when the stopping positions (the mounting positions) of the two substrates 2-1 and 2-2 are set such that the movement distance of the mounting heads is shortest, there is a concern that cases in which the two mounting heads interfere with each other will increase and the time for avoiding the interference will increase.

The present disclosure was made in order to solve the problems described above, and an object thereof is to determine optimal substrate stopping positions while achieving both the avoidance of interference between the two mounting heads and shortening of the moving time in an electronic component mounting machine.

Solution to Problem

In order to solve the problems described above, according to the present disclosure, there is provided a substrate stopping position determination method of a component mounting machine which, in order to transport first and second substrates along a conveyance direction and mount electronic components on each, is provided with first and second substrate conveyance lanes which cause the first and second substrates to stop at each set position among a plurality of first and second side set positions which are set along the conveyance direction, and first and second mounting heads which mount the electronic components of first and second component supply devices, respectively, to the first and second substrates which are stopped in each of the set positions of the first and second sides, the method including a movement time calculation step of calculating respective movement times in which the first and second mounting heads move respectively in order to mount the electronic components when the first substrate is positioned in one set position of the first side and the second substrate is positioned in one set position of the second side, an interference loss time calculation step of calculating a waiting time which is a time in which, while one of the first and second mounting heads enters an interference area, the other waits to enter the interference area as an interference loss time based on a probability that, when one of the first and second mounting heads is anticipated to enter the interference area, the other is moving within the interference area, and based on the movement time in an interference area in which there is a likelihood that the first and second mounting heads which correspond to the respective first and second substrates which are each positioned in the same set positions as in the movement time calculation step will interfere with each other, and a stopping position determination step of determining the first side set position and the second side set position which are selected from among all combinations as substrate stopping positions based on total movement times which are calculated for all of the combinations of the first side set position and the second side set position by the movement time calculation step and the interference loss time which is calculated by the interference loss time calculation step.

BRIEF DESCRIPTION OF DRAWINGS

FIG. 11 is a diagram illustrating total movement times and interference loss times in all combinations of the first side set position and the second side set position.

FIG. 14 illustrates both interference loss times of the first and second mounting heads and the total of both interference loss times for each subdivision area.

FIG. 15 illustrates both interference loss times of the first and second mounting heads and the total of both interference loss times for each subdivision area except for a fourth subdivision area for which the interference loss time is already calculated.

DESCRIPTION OF EMBODIMENTS

Figure 1:
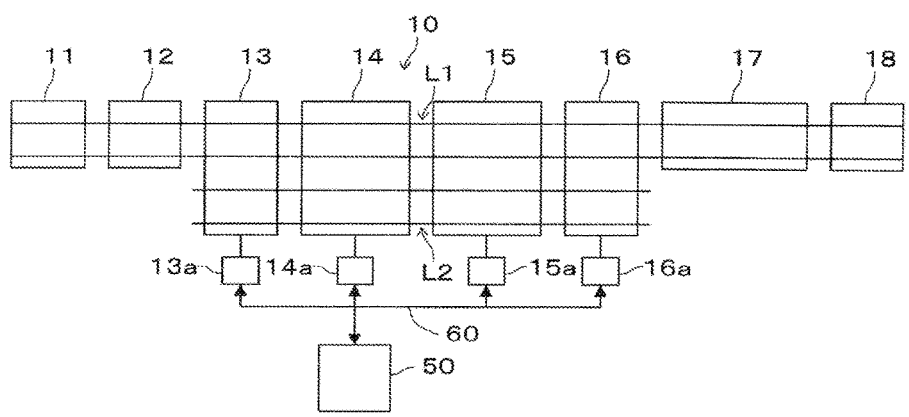
FIG. 1 is a plan view illustrating the overall arrangement of a component mounting system which is provided with a mounting line including a substrate stopping position determination device (a substrate stopping position determination method) to which the present disclosure is applied.

Hereinafter, description will be given of an embodiment of the substrate stopping position determination device and the substrate stopping position determination method according to the present disclosure. FIG. 1 is a plan view illustrating the overall arrangement of a component mounting system which is provided with a mounting line 10 including a substrate stopping position determination device to which the present disclosure is applied. The component mounting system is formed of the mounting line 10 and a host computer 50 (the substrate stopping position determination device) which controls the mounting line 10. The mounting line 10 is formed of a substrate supplying device 11, a printing device 12, a first shift device 13, a first electronic component mounting machine 14, a second electronic component mounting machine 15, a second shift device 16, a reflow device 17, and a substrate storage device 18, which are arranged in series. The first and second electronic component mounting machines 14 and 15 are not limited to two, one may be provided, and three or more may be provided in series.

The substrate supplying device 11 stores multiple first and second substrates S1 and S2 (refer to FIG. 2) lined up in a vertical direction, and the first and second substrates S1 and S2 are fed into the printing device 12 one at a time. The printing device 12 prints cream solder onto the electronic component mounting positions of the first and second substrates S1 and S2 which are fed thereto and feeds out the first and second substrates S1 and S2 to the first shift device 13.

The first shift device 13 reads IDs which are provided on the first and second substrates S1 and S2 using an ID recognition unit (not illustrated), assigns the first and second substrates S1 and S2 to a first and a second line L1 and L2 based on a pre-set schedule, and feeds out the first and second substrates S1 and S2 to the first electronic component mounting machine 14. The first shift device 13 is provided with a control device 13a for performing such control.

In the first electronic component mounting machine 14, electronic components are mounted to the first and second substrates S1 and S2 which are fed out from the first shift device 13, and subsequently, the electronic components are mounted in the second electronic component mounting machine 15 and the first and second substrates S1 and S2 are fed out to the second shift device 16. The first and second electronic component mounting machines 14 and 15 are provided with control sections 14a and 15a, respectively, have essentially the same configuration, and will be described later in detail.

The second shift device 16 feeds the first and second substrates S1 and S2 which are fed thereto from the first and second lines L1 and L2 of the second electronic component mounting machine 15 into the reflow device 17 of the first line L1, and is provided with a control device 16a for performing such control.

The reflow device 17 performs soldering on the first and second substrates S1 and S2 onto which the electronic components are mounted, and feeds the first and second substrates S1 and S2 out to the substrate storage device 18. The substrate storage device 18 stores the first and second substrates S1 and S2 which are subjected to soldering lined up in the vertical direction.

Figure 2:
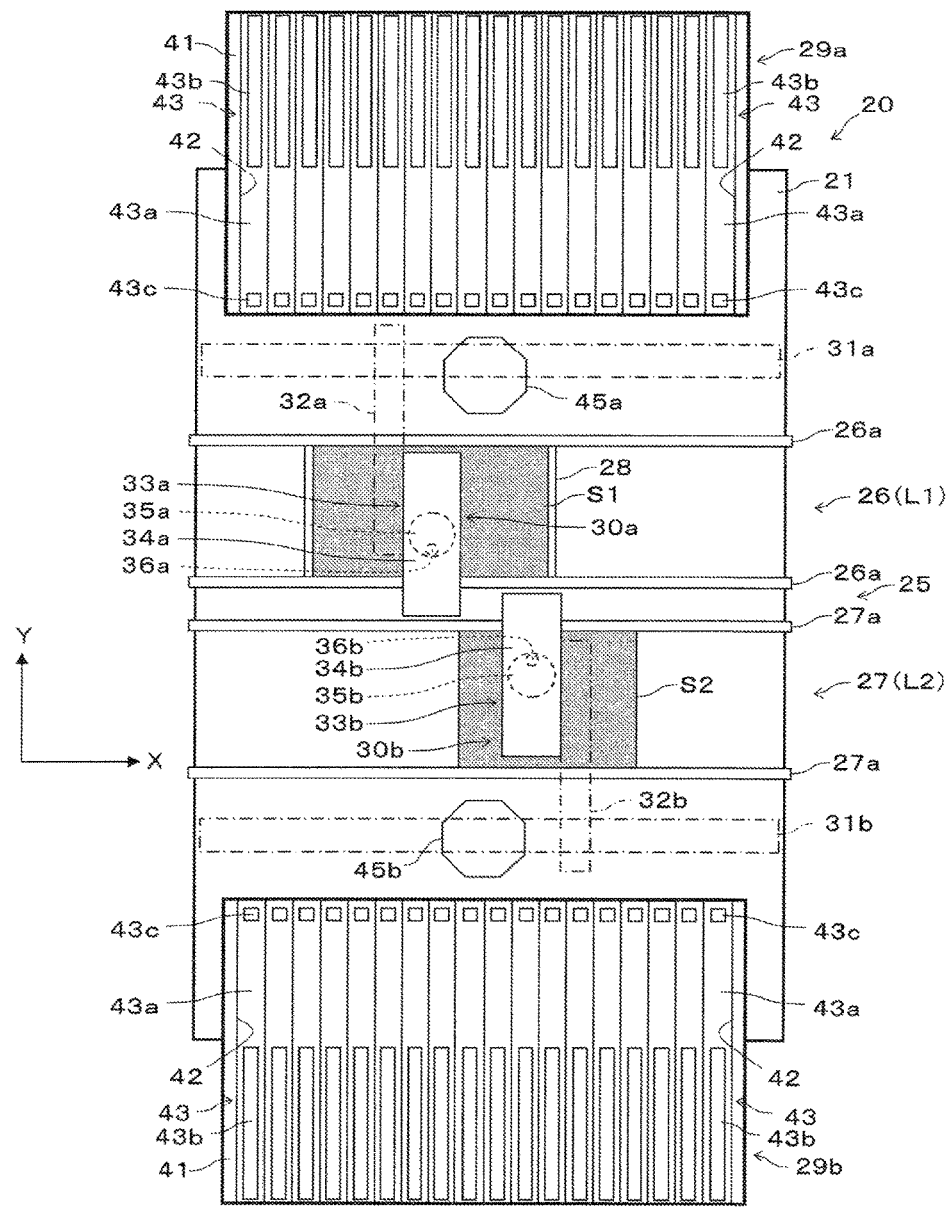
FIG. 2 is a plan view illustrating an electronic component mounting machine illustrated in FIG. 1.
Figure 3:
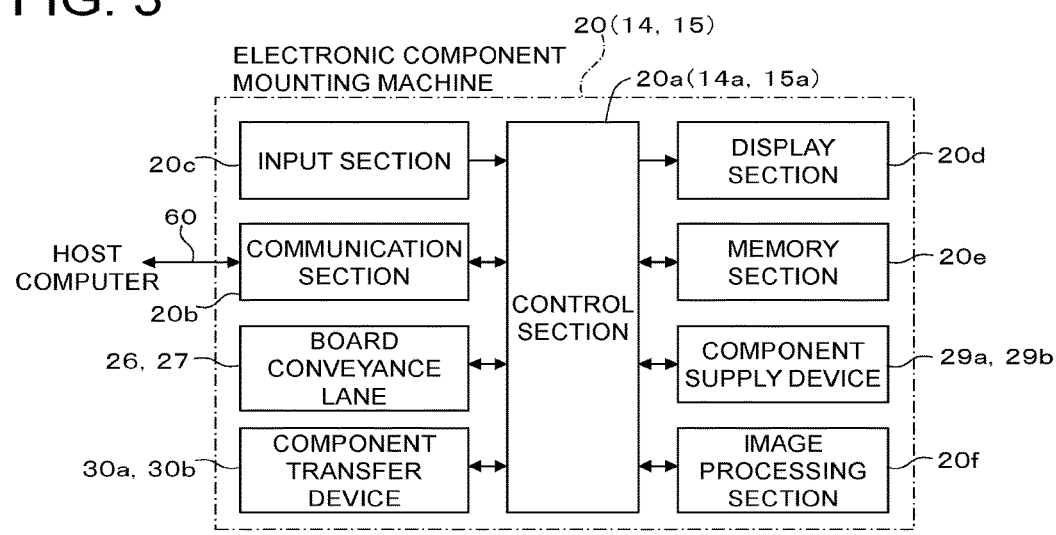
FIG. 3 is a functional block diagram illustrating the electronic component mounting machine illustrated in FIG. 1.

Since the first and second electronic component mounting machines 14 and 15 have essentially the same configuration, description will be given of the first electronic component mounting machine (hereinafter simply referred to as an electronic component mounting machine) 14 (20). As illustrated in FIG. 2, the electronic component mounting machine 20 of this embodiment is a double track conveyor system device, and a substrate conveyance device 25 which conveys the first and second substrates S1 and S2 in an X-axis rightward direction in the drawing is provided on a base 21 of the electronic component mounting machine 20.

The substrate conveyance device 25 is formed of first and second substrate conveyance lanes 26 and 27 which are provided parallel to each other on the base 21. The first substrate conveyance lane 26 forms a portion of the line L1, and the second substrate conveyance lane 27 forms a portion of the line L2. The first and second substrate conveyance lanes 26 and 27 respectively convey the first and second substrates S1 and S2 along the conveyance direction (the X-axis direction).

The first and second substrate conveyance lanes 26 and 27 are respectively provided with first and second guide rails 26a and 27a, each of which is a pair extending parallel to each other in the X-axis direction, and therebelow a pair of endless conveyor belts (not illustrated) is provided in parallel with each other for each. Each of the first and second substrates S1 and S2 is supported on a tension section of the top side of each of the conveyor belts, is supported by each of the guide rails 26a and 27a, and is conveyed rightward in the X-axis direction. Note that, each of the conveyor belts and each of the guide rails 26a and 27a is capable of positional adjustment in a horizontal direction (a Y-axis direction) which orthogonally intersects the conveyance direction, and therefore, it is possible to handle the first and second substrates S1 and S2 with different widths.

A back-up device 28 which pushes up the substrate S1 which is conveyed to a predetermined mounting position via multiple back-up pins for positioning support is provided in the substrate conveyance device 25. In FIG. 2, only the back-up device 28 of the first substrate conveyance lane 26 is displayed, and the back-up device of the second substrate conveyance lane is not displayed. In order to mount the electronic components, the first substrate conveyance lane 26 causes the first substrate S1 to stop at one set position of a plurality of first side set positions which are set along the conveyance direction. In order to mount the electronic components, the second substrate conveyance lane 27 causes the second substrate S2 to stop at one set position of a plurality of second side set positions which are set along the conveyance direction.

First and second component supply devices 29a and 29b are provided in the electronic component mounting machine 20 on both sides to interpose the substrate conveyance device 25 therebetween. Each of the component supply devices 29a and 29b is formed of a component supply stage 41 which is fixed on the base 21 of the electronic component mounting machine 20, multiple slots (supply unit holding sections) 42 which are provided to line up along the conveyance direction of the first and second substrates S1 and S2 above the component supply stage 41, and cassette feeders (component supplying sections) 43 which are set in each of the slots 42 in a detachable manner.

Each of the cassette feeders 43 is formed of a main body 43a and a supply reel 43b which is provided on the rear portion thereof, and a component removal section 43c is provided on the leading end portion of the main body 43a which is the substrate conveyance device 25 side. A long and narrow tape (omitted from the drawings) in which electronic components are sealed at a predetermined pitch is supported by being wound around the supply reel 43b, the tape is fed into the component removal section 43c at a predetermined pitch by a sprocket (not illustrated), and, in the component removal section 43c, the sealed state is released to enable the removal of the electronic component. Note that, the component supply unit 43 is not limited to a cassette system, may use a tray system in which multiple electronic components are lined up on a tray, and in this case, the slot 42 adopts a corresponding structure.

First and second component transfer devices 30a and 30b which pick the electronic components from the component removal section 43c of each of the cassette feeders 43 and mount the electronic components in predetermined mounting positions of the first and second substrates S1 and S2, respectively, are provided above (in the drawing, the upward side of a direction orthogonally intersecting the paper surface) the substrate conveyance device 25.

The first component transfer device 30a is of an XY robot type, and is provided with a first Y-axis slider 31a which is arranged above the substrate conveyance device 25 and the first component supply device 29a to be capable of moving relative to the base 21 and is moved along the Y-axis direction by a Y-axis motor (not illustrated), and a first X-axis slider 32a which is supported to be capable of moving relative to the first Y-axis slider 31a and is moved along the X-axis direction by an X-axis motor (omitted from the drawing).

A first mounting head 33a is provided on the first X-axis slider 32a. The first mounting head 33a is provided with a base 34a which is moved along the Z-axis direction (a direction orthogonally intersecting the X-axis direction and the Y-axis direction) by a Z-axis motor (not illustrated), a nozzle holding portion 35a which is supported by a base 34a and holds a suction nozzle 36a, and the cylindrical suction nozzle 36a which is provided to protrude downward from the nozzle holding portion 35a and adhesively holds the electronic component on the bottom end.

The first component transfer device 30a adhesively picks and lifts the electronic component from the component removal section 43c of the cassette feeder 43 using the suction nozzle 36a of the bottom end of the first mounting head 33a, moves the electronic component in the Y-axis direction and the X-axis direction using the first Y-axis slider 31a and the first X-axis slider 32a, lowers the component to a predetermined position and mounts the electronic component on the first substrate S1. In this manner, the first mounting head 33a mounts the electronic component of the first component supply device 29a on the first substrate S1 which is stopped in a set position of the first side.

In the same manner as the first component transfer device 30a, the second component transfer device 30b is provided with a second Y-axis slider 31b, a second X-axis slider 32b, and a second mounting head 33b. In the same manner as the first mounting head 33a, the second mounting head 33b is provided with a base 34b, a nozzle holding portion 35b, and a suction nozzle 36b. The second mounting head 33b mounts the electronic component of the second component supply device 29b on the second substrate S2 which is stopped in a set position of the second side.

In the present embodiment, each of the mounting heads 33a (or 33b) is provided with the single suction nozzle 36a (or 36b) and mounts a single electronic component at a time; however, each of the mounting heads 33a (or 33b) may be provided with a plurality of the suction nozzles 36a (or 36b) and suck a plurality of electronic components from the corresponding cassette feeders 43 and mount the electronic components in batches.

A first imaging device 45a is provided between the first substrate conveyance lane 26 and the first component supply device 29a. The first imaging device 45a images, from below, and recognizes the suction state of the electronic component which is sucked by the suction nozzle 36a which is provided on the first mounting head 33a. A second imaging device 45b is provided between the second substrate conveyance lane 27 and the second component supply device 29b. The second imaging device 45b images, from below, and recognizes the suction state of the electronic component which is sucked by the suction nozzle 36b which is provided on the second mounting head 33b.

An input section 20c, a display section 20d, a rewritable memory section 20e, the substrate conveyance lanes 26 and 27, the component supply devices 29a and 29b, the component transfer devices 30a and 30b, and an image processing section 20f are connected to a control section 20a. A worker operates the input section 20c to input commands, data, and the like which are necessary for the mounting of the substrate. The display section 20d displays various states relating to substrate mounting control. The memory section 20e stores a system program which controls the overall device, a control program which individually controls each of the elements of the device in the system program, a production program of the substrate, a calibration program, and other various application programs and data. The image processing section 20f processes the image data of the components which are imaged by the imaging devices 45a and 45b and are part way through being transferred, the image data of the imaged substrates, and the like.

Figure 4:
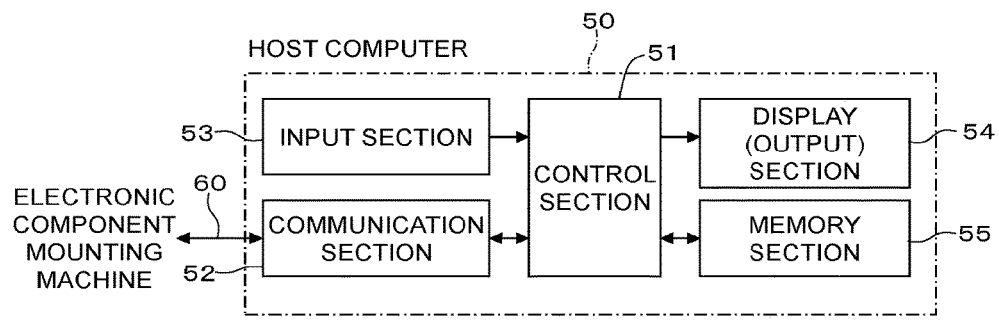
FIG. 4 is a functional block diagram illustrating a host computer illustrated in FIG. 1.

The host computer 50 mainly performs control to manage the operation of each of the electronic component mounting machines 20, and determines the position (hereinafter referred to as the substrate stopping position) at which to stop the first substrate S1 (or the second substrate S2) in order to mount the electronic components in the first substrate conveyance lane 26 (or the second substrate conveyance lane 27). As illustrated in FIG. 4, the host computer 50 is provided with a control section 51, and a communication section 52 which is connected to the control section 51 is connected to the electronic component mounting machines 20 via a LAN 60. The control section 51 includes a micro computer (not illustrated), and the micro computer is provided with an input-output interface, a CPU, a RAM, and a ROM (all omitted from the drawings), each of which is connected via a bus. The CPU executes a predetermined program, executes control which manages the operation of each of the electronic component mounting machines 20 and the like, and determines the substrate stopping positions in each of the substrate conveyance lanes 26 and 27. The RAM temporarily stores variables which are necessary for the execution of the same program, and the ROM stores the program.

An input section 53, a display section (an output section) 54, and a rewritable memory section 55 are connected to the control section 51. The worker operates the input section 53 to input the information, data, and the like which are necessary. The display section 54 displays various states relating to substrate mounting control. The memory section 55 stores information (for example, the number of components consumed, the number of components used per substrate, the production time per substrate, the number planned for production, the number of produced substrates, and the like) relating to the operational states which are captured from each of the electronic component mounting machines 20. Note that, a configuration may be adopted in which there is a plurality of the mounting lines 10, and the single host computer 50 performs the overall management thereof.

Next, description will be given of the substrate stopping position determination method in the component mounting system which is configured as described above, with reference to the flowcharts illustrated in FIGS. 5 and 6. The substrate stopping position determination method is performed by the host computer 50.

Figure 5:
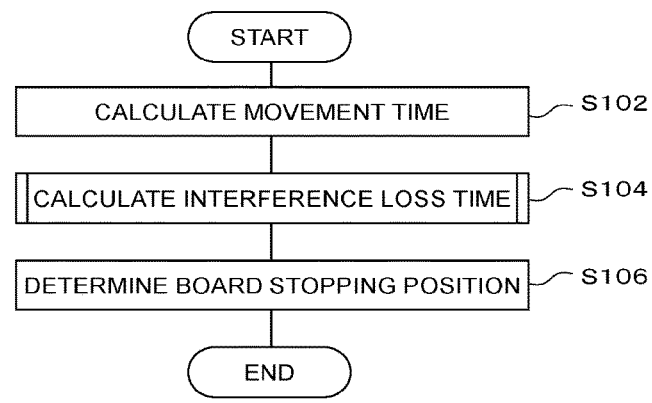
FIG. 5 is a flowchart explaining a substrate stopping position determination method which is carried out by a host computer of an embodiment of the present disclosure.

The control section 51 of the host computer 50 starts executing the program corresponding to the flowchart illustrated in FIG. 5 when the determination work of the substrate stopping position is started by an operator. In step S102, the control section 51 calculates the movement time (a cycle time, the movement time calculation step). In other words, when the first substrate S1 is positioned in one of the set positions of the first side and the second substrate S2 is positioned in one of the set positions of the second side, the control section 51 calculates the movement time in which the first mounting head 33a moves between the first component supply device 29a and the first substrate S1 in order to mount the electronic component, and calculates the movement time in which the second mounting head 33b moves between the second component supply device 29b and the second substrate S2 in order to mount the electronic component.

Figure 7:
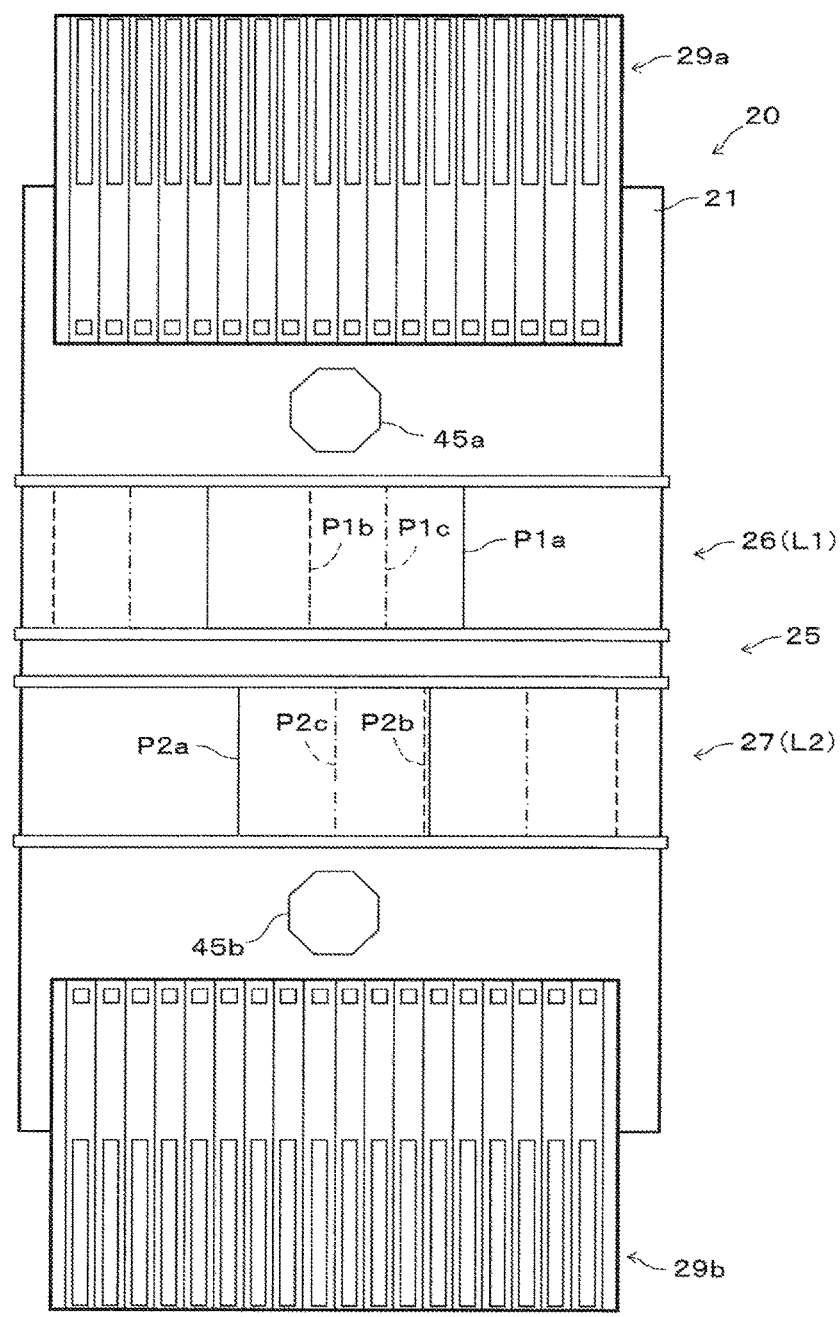
FIG. 7 is a plan view illustrating a first side set position and a second side set position.

One set position of the first side is one set position of a plurality of first side set positions (candidates of substrate stopping positions of the first substrate S1 side). In the present embodiment, as illustrated in FIG. 7, three first side set positions P1a, P1b, and P1c are set. The set position P1a is a front position (opposing position) of the imaging device 45a, the set position P1b is an endmost position of the first substrate conveyance lane 26, and the set position P1c is an intermediate position between the two set positions P1a and P1b.

One set position of the second side is one set position of a plurality of second side set positions (candidates of substrate stopping positions of the second substrate S2 side). In the present embodiment, as illustrated in FIG. 7, three second side set positions P2a, P2b, and P2c are set. The set position P2a is a front position (opposing position) of the imaging device 45b, the set position P2b is an endmost position (an end of the opposite side from the set position P1b of the first side) of the second substrate conveyance lane 27, and the set position P1c is an intermediate position between the two set positions P1a and P1b. Note that, although three positions are set in the first and second side set positions, respectively, four or more may be set respectively.

Description will be given of the calculation method of the movement time. In the present embodiment, since there is only one of the suction nozzles 36a (or 36b), the movement time is the time necessary to move the electronic components one at a time. In other words, the movement time of one electronic component is the time in which the first mounting head 33a sucks the electronic component from one of the component removal sections 43c of the first component supply device 29a, and after the suction state is imaged by the first imaging device 45a and mounted on a predetermined mounting position of the first substrate S1, moves along the movement path until the next electronic component is sucked to by the next component removal section 43c of the first component supply device 29a.

Note that, when a plurality of suction nozzles is provided, the movement time is the time for moving along the movement path until returning to the first component supply device 29a after, first, a plurality of electronic components is sucked, next, the suction state thereof is imaged by the first imaging device 45a, and each of the electronic components is mounted to each predetermined mounting position of the first substrate S1. Since the movement path differs depending on the set positions of the first component supply device 29a (or 29b) and the first imaging device 45a (or 45b), the stopping position of the first substrate S1 (or the second substrate S2) differs depending on these set positions.

In step S104, the control section 51 calculates the interference loss time (the time lost due to interference, the interference loss time calculation step). The interference loss time is the waiting time which is the time, while one of the first and second mounting heads 33a and 33b enters an interference area Aa, the other waits to enter the interference area Aa based on the probability that, when one of the first and second mounting heads 33a and 33b is anticipated to enter the interference area Aa, the other is moving within the interference area Aa, and based on the movement time.

Figure 6:
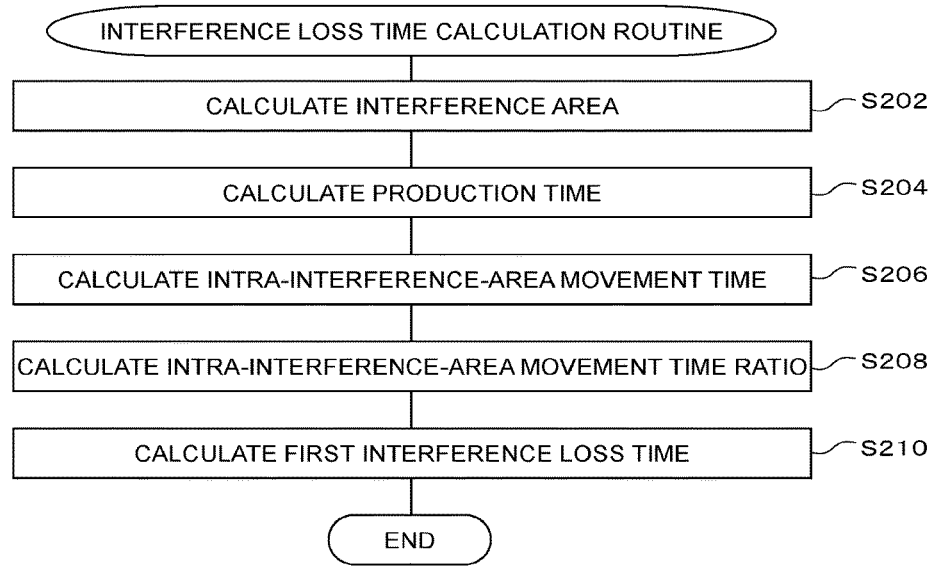
FIG. 6 is a flowchart illustrating the subroutine according to interference loss time calculation illustrated in FIG. 5.
Figure 8:
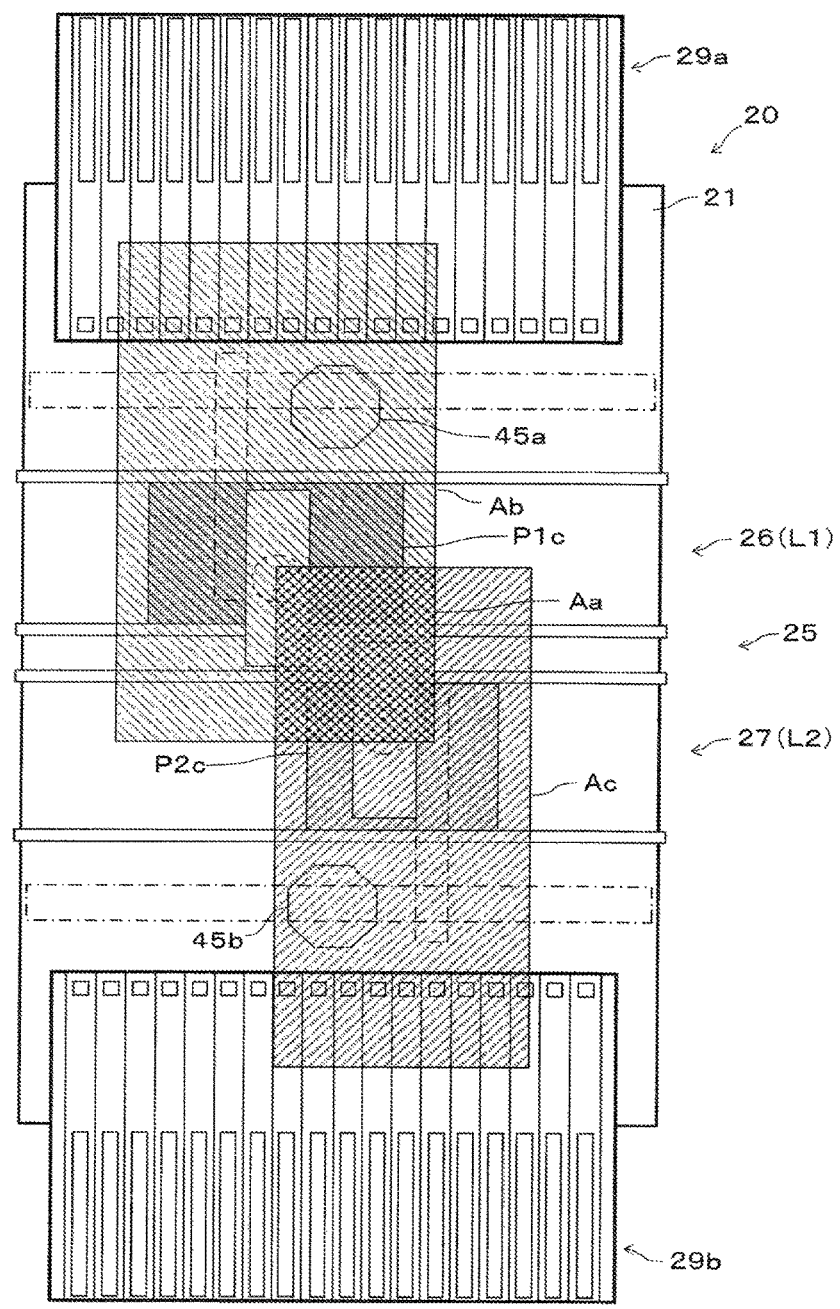
FIG. 8 is a plan view illustrating an occupation area of a first mounting head, an occupation area of a second mounting head, and an interference area.

Specifically, the control section 51 executes the interference loss time calculation routine (subroutine) illustrated in FIG. 6 and calculates the interference loss time. In other words, in step S202, the control section 51 calculates the interference area Aa. As illustrated in FIG. 8, the interference area Aa is an area (region) in which there is a likelihood that the first and second mounting heads 33a and 33b which correspond to the first and second substrates S1 and S2, respectively, which are positioned in the same corresponding set positions (for example, the set position P1c for the first substrate S1 and the set position P2c for the second substrate S2) as in step S102 described above will interfere with each other.

Description will be given of the calculation method of the interference area Aa. The interference area Aa is the region in which a first occupation area Ab which is occupied by the first mounting head 33a overlaps a second occupation area Ac which is occupied by the second mounting head 33b. The first occupation area Ab is an area occupied by the first mounting head 33a when producing (mounting) the substrate, that is, the maximum area in which there is a likelihood that the first mounting head 33a will move (pass through). The first occupation area Ab is calculated from the size of the substrate, the stopping position of the substrate, the size of the mounting head, the mounting position (the mounting coordinates) of the electronic components, and the like.

Figure 9:
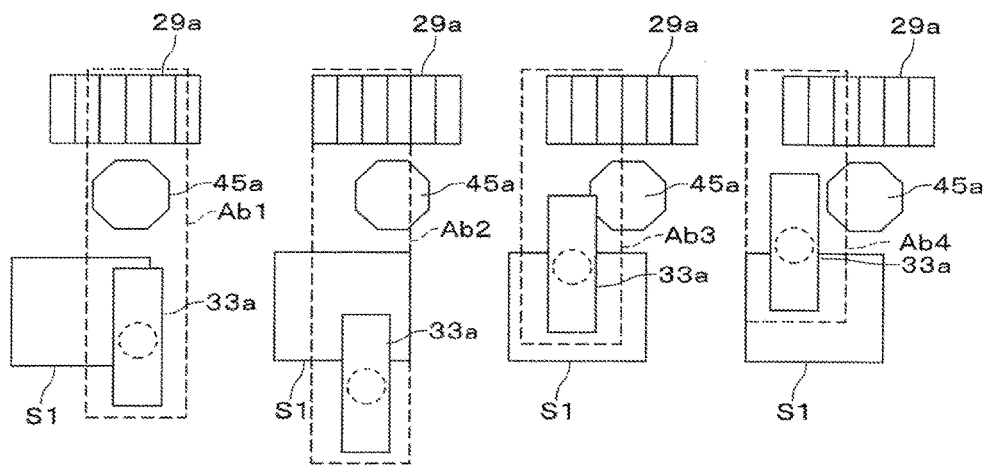
FIG. 9 is a plan view illustrating single areas.

Specifically, first, each single area is calculated for each single step (step), a joined area is calculated from the single areas, and finally, the occupation area is calculated. A single area is an area in which there is a likelihood that a certain mounting head will pass through in a movement path (a path passing through a suction position, an image processing position, a mounting position, and the like) in one step of the first mounting head 33*a* (or the second mounting head 33*b*). For example, as in the present embodiment, when there is one suction nozzle, there is a suction step, an image processing step, and a mounting step for each single electronic component; however, when there is a plurality of suction nozzles, there is a suction step, an image processing step, and a mounting step for each group of a plurality of electronic components. In the present embodiment, as illustrated in FIG. 9, description will be given of a case in which four electronic components are mounted, for example. In FIG. 9, first to fourth single areas Ab1 to Ab4 which are the single areas of the first to fourth electronic components in order from the left are illustrated.

Figure 10:
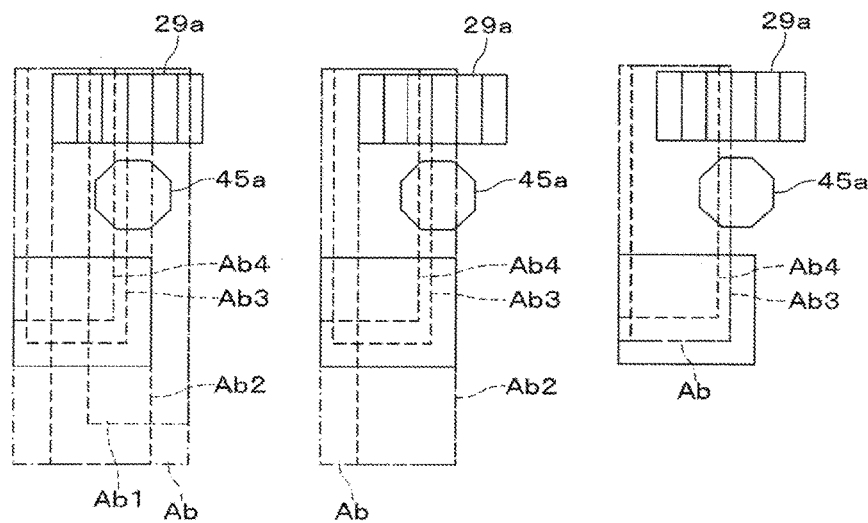
FIG. 10 is a plan view for explaining a calculation method of an occupation area of the first mounting head.

The occupation area is an area which is calculated by joining all of the single areas. As illustrated leftmost in FIG. 10, a joined area obtained by joining all of the first to fourth single areas Ab1 to Ab4 is the occupation area Ab. As illustrated second from the left, a joined area obtained by joining all of the second to fourth single areas Ab2 to Ab4 is the occupation area Ab. As illustrated third from the left, a joined area obtained by joining all of the third to fourth single areas Ab3 to Ab4 is the occupation area Ab. Every one of the occupation areas Ab is the smallest area of a rectangle shape which is formed to contain at least all of the target single areas. The joined area is formed by joining all of the single areas of the following steps during the execution of the step (including the step). Accordingly, in the present embodiment, the occupation area Ab of the first mounting head 33*a* is illustrated on the leftmost side in FIG. 10.

In step S204, the control section 51 calculates the production time (a production time calculation step). The production time is the sum of the movement times described above for all of the electronic components to be mounted to the substrate. In other words, the first and second production times are the times taken to mount all of the electronic components to be mounted to the first and the second substrates S1 and S2, respectively. The production time may be calculated by the host computer 50, and may be acquired from the electronic component mounting machine 20.

In step S206, the control section 51 calculates the intra-interference-area movement time (intra-interference-area movement time calculation step). In step S202, when the single area during the execution of each single step (step) described above overlaps the interference area Aa, the control section 51 calculates a value obtained by adding all of the movement times corresponding to the single area as the intra-interference-area movement time. In other words, when the single area during the execution of each single step (step) does not overlap the interference area Aa, the movement time corresponding to that single area is not added. In this manner, the intra-interference-area movement time calculation step (step S206) calculates, when the first and second mounting heads 33*a* and 33*b* pass through the interference area Aa which is calculated by step S202 (the interference area calculation step) during the mounting of all of the respective electronic components, the movement times of the first and second mounting heads 33*a* and 33*b* in this case as the first and second intra-interference-area movement times, respectively.

In step S208, the control section 51 calculates the intra-interference-area movement time ratio (intra-interference-area movement time ratio calculation step). The control section 51 calculates the proportions of the first and second intra-interference-area movement times which are calculated by step S206 (the intra-interference-area movement time calculation step) described above in relation to the first and second production times which are each calculated by step S204 (the production time calculation step) described above as the first and second intra-interference-area movement time ratios, respectively, which are probabilities of the first and second sides.

For example, as illustrated in table 1 below, when the first production time and the first intra-interference-area movement time of the first mounting head 33*a* are 25 seconds and 15 seconds, respectively, and the second production time and the second intra-interference-area movement time of the second mounting head 33*b* are 30 seconds and 12 seconds, respectively, the first intra-interference-area movement time ratio is 600 (=15/25×100), and the second intra-interference-area movement time ratio is 40% (=12/30×100).

TABLE 1

|  | First Mounting Head | Second Mounting Head |
| --- | --- | --- |
| Production Time | 25 seconds | 30 seconds |
| Intra-Interference-Area Movement Time | 15 seconds | 12 seconds |
| Intra-Interference-Area Movement Time Ratio | 60% | 40% |
| Interference Loss Time | 6 seconds (15 seconds × 40%) | 7.2 seconds (12 seconds × 60%) |

In step S210, the control section 51 calculates the first interference loss time (a first interference loss time calculation step). The control section 51 calculates a value obtained by multiplying the intra-interference-area movement time of one of the first and second mounting heads 33*a* and 33*b* which is calculated by step S206 (the intra-interference-area movement time calculation step) described above by the intra-interference-area movement time ratio of the other of the first and second mounting heads 33*a* and 33*b* which is calculated by step S208 (the intra-interference-area movement time ratio calculation step) described above as the interference loss time.

For example, the first interference loss time of the first mounting head 33*a* is a value (6 seconds) obtained by multiplying the intra-interference-area movement time (15 seconds) of the first mounting head 33*a* by the intra-interference-area movement time ratio (40%) of the second mounting head 33*b*. The first interference loss time of the second mounting head 33*b* is a value (7.2 seconds) obtained by multiplying the intra-interference-area movement time (12 seconds) of the second mounting head 33*b* by the intra-interference-area movement time ratio (60%) of the first mounting head 33*a*.

In this manner, the interference loss time is calculated as the time in which, while one of the first and second mounting heads 33*a* and 33*b* enters the interference area Aa, the other waits to enter the interference area Aa based on the probability that, when one of the first and second mounting heads 33*a* and 33*b* is anticipated to enter the interference area Aa, the other is moving within the interference area Aa, and based on the movement time.

When the process of step S210 is completed, the control section 51 returns the program to step S106 of FIG. 5, and in step S106, determines the substrate stopping position (a stopping position determination step). The control section 51 determines the first side set position and the second side set position which are selected from among all of the combinations as the substrate stopping positions based on the total movement time which is calculated for all of the combinations of the first side set position and the second side set position by step S102 (the movement time calculation step) and the interference loss time (the first interference loss time) obtained by step S104 (the interference loss time calculation step).

For example, the control section 51 determines, as the substrate stopping positions, the first side set position and the second side set position for which the total of the total movement time which is calculated for all of the combinations of the first side set position and the second side set position by step S102 (the movement time calculation step) and the interference loss time obtained by step S104 (the interference loss time calculation step) is the smallest.

Specifically, as illustrated in the top level of FIG. 11, each total movement time of the first and second mounting heads 33a and 33b is illustrated for all combinations (nine patterns in the present embodiment) of the first side set positions (P1a (front position), P1c (intermediate position), and P1b (endmost position)) and the second side set positions (P2a (front position), P2c (intermediate position), and P2b (endmost position)). For example, when the first side set position is P1a and the second side set position is P2a, the total movement time is 20 seconds. The movement time depends on the positional relationship between the imaging device 45a and the first substrate S1, that is, the size of the distance. The longer the distance, the greater the movement time, and the shorter the distance, the smaller the movement time.

As illustrated in the bottom level of FIG. 11, each total interference loss time of the first and second mounting heads 33a and 33b is illustrated for all combinations (nine patterns in the present embodiment) of the first side set positions (P1a (front position), P1c (intermediate position), and P1b (endmost position)) and the second side set positions (P2a (front position), P2c (intermediate position), and P2b (endmost position)). For example, when the first side set position is P1a and the second side set position is P2a, the total movement time is 20 seconds.

The interference loss time depends on the positional relationship between the first substrate S1 and the second substrate S2, that is, the distance between both substrates. The longer the distance (the further between both substrates), the smaller the interference loss time, and the shorter the distance (the closer between both substrates), the greater the interference loss time.

As clear from FIG. 11, the smallest total of the total movement time and the interference loss time which are calculated for all combinations of the first side set position and the second side set position is a case in which the first side set position is P1c, the second side set position is P2c and the total of both times is 35 seconds. Accordingly, the control section 51 determines P1c (the intermediate position among the first side set positions) and P2c (the intermediate position among the second side set positions) as the substrate stopping positions.

According to the embodiment described above, a substrate stopping position determination method (a substrate stopping position determination device (the host computer 50)) is provided with step S102 (a movement time calculation step, a movement time calculation section) of calculating respective movement times in which the first and second mounting heads 33a and 33b move respectively in order to mount electronic components when the first substrate S1 is positioned in one set position of a first side and the second substrate S2 is positioned in one set position of a second side, step S104 (an interference loss time calculation step, an interference loss time calculation section) of calculating a waiting time which is a time in which, while one of the first and second mounting heads 33a and 33b enters the interference area Aa, the other waits to enter the interference area Aa as an interference loss time based on a probability that, when one of the first and second mounting heads 33a and 33b is anticipated to enter the interference area Aa, the other is moving within the interference area Aa, and based on a movement time in the interference area Aa in which there is a likelihood that the first and second mounting heads 33a and 33b which correspond to the respective first and second substrates S1 and S2 which are each positioned in the same set positions as in step S102 (the movement time calculation step, the movement time calculation section) will interfere with each other, and step S106 (a stopping position determination step, a stopping position determination section) of determining the first side set position and the second side set position which are selected from among all combinations as substrate stopping positions based on total movement times which are calculated for all of the combinations of the first side set position and the second side set position by step S102 (the movement time calculation step, the movement time calculation section) and the interference loss time which is calculated by step S104 (the interference loss time calculation step, the interference loss time calculation section).

Accordingly, the substrate stopping positions of the first and second substrates S1 and S2 are determined from the total movement time and the interference loss time which are calculated for all combinations of the first side set position and the second side set position with consideration given to avoiding interference between the production time of a present mounting head (for example, the first mounting head 33a) and another mounting head (for example, the second mounting head 33b). Accordingly, it is possible to determine the optimal substrate stopping positions while achieving both the avoiding of interference between the two mounting heads 33a and 33b and the shortening of the movement times of both of the mounting heads 33a and 33b.

Step S106 (the stopping position determination step, the stopping position determination section) determines the first side set position and the second side set position for which the total of the total movement time which is calculated for all of the combinations of the first side set position and the second side set position by step S102 (the movement time calculation step, the movement time calculation section) and the interference loss time obtained by step S104 (the interference loss time calculation step, the interference loss time calculation section) is the smallest as the substrate stopping positions. Accordingly, it is possible to easily and accurately determine the substrate stopping positions of the first and second substrates S1 and S2.

Step S104 (the interference loss time calculation step, the interference loss time calculation section) includes step S202 (an interference area calculation step) of calculating the interference area Aa, step S204 (a production time calculation step) of calculating both first and second production times which are time taken to mount all of the electronic components to be mounted to the first and second substrates S1 and S2, respectively, step S206 (an intra-interference-area movement time calculation step) of calculating, when the first and second mounting heads 33a and 33b pass through the interference area Aa which is calculated by step S202 (the interference area calculation step) during the mounting of all of the respective electronic components, the movement times of the first and second mounting heads 33a and 33b in this case as first and second intra-interference-area movement times, respectively, step S208 (an intra-interference-area movement time ratio calculation step) of calculating proportions of the first and second intra-interference-area movement times which are calculated by step S206 (the intra-interference-area movement time calculation step) in relation to the first and second production times which are each calculated by S204 (the production time calculation step) as the first and second intra-interference-area movement time ratios, respectively, which are probabilities of the first and second sides, and step S210 (a first interference loss time calculation step) of calculating a value obtained by multiplying the intra-interference-area movement time of one of the first and second mounting heads 33a and 33b which is calculated by S206 (the intra-interference-area movement time calculation step) by the intra-interference-area movement time ratio of the other of the first and second mounting heads 33a and 33b which is calculated by step S208 (the intra-interference-area movement time ratio calculation step) as the interference loss time. Accordingly, it is possible to accurately and reliably calculate the interference loss time, and thus it is possible to accurately and reliably determine the substrate stopping positions of the first and second substrates S1 and S2.

Figure 12:
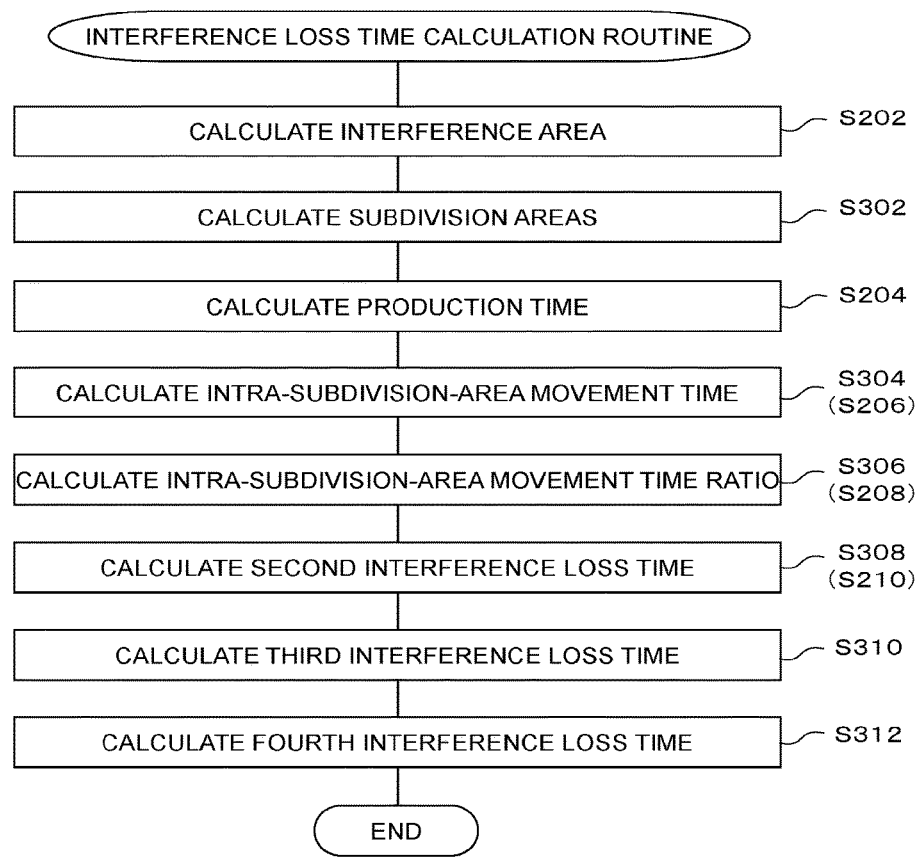
FIG. 12 is a flowchart illustrating a modification example (subdivision areas) of the subroutine according to the interference loss time calculation illustrated in FIG. 5.
Figure 13:
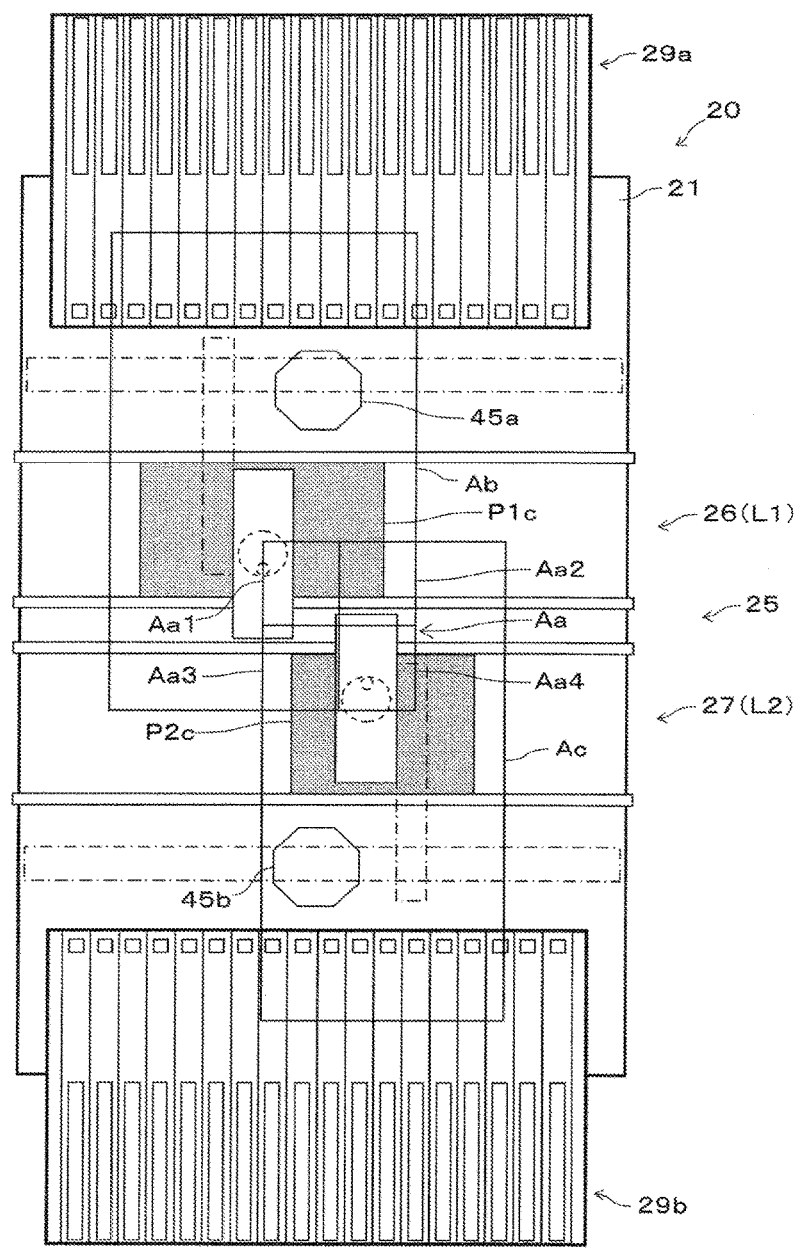
FIG. 13 is a plan view illustrating the occupation area of the first mounting head, the occupation area of the second mounting head, the interference area, and subdivision areas.

In the embodiment described above, the interference area Aa may be subdivided and the interference loss times thereof may be calculated. In this case, description will be given of the determination method of the substrate stopping positions with reference to the flowchart illustrated in FIG. 12. With regard to the same processes as in the flowchart illustrated in FIG. 6, the same reference symbols will be assigned and description thereof will be omitted.

After the completion of step S202, the control section 51 calculates (derives) a plurality of subdivision areas by further subdividing the interference area Aa in step S302 (a subdivision area calculation step). The subdivision areas are areas obtained by subdividing the interference area Aa equally vertically and horizontally (divided into four in the present embodiment). The subdivision areas of the present embodiment are formed of first to fourth subdivision areas Aa1 to Aa4.

After the completion of step S302, in step S304 after the production time is calculated (step S204), the control section 51 calculates the intra-subdivision-area movement time by performing essentially the same process as step S206 (intra-subdivision-area movement time calculation step). The control section 51 calculates, when the first and second mounting heads 33a and 33b pass through the each of the subdivision areas which is calculated by step S304 (the subdivision area calculation step) during the mounting of all of the respective electronic components, the movement times of the first and second mounting heads 33a and 33b in this case as the first side and second side intra-subdivision-area movement times, respectively.

For example, when the first mounting head 33a passes through the first subdivision area Aa1, the movement time of the first mounting head 33a in this case is calculated as the first side intra-subdivision-area movement time (the first side intra-subdivision-area movement time according to the first subdivision area Aa1). The same applies to the second to fourth subdivision areas Aa2 to Aa4. When the second mounting head 33b passes through the first subdivision area Aa1, the movement time of the second mounting head 33b in this case is calculated as the second side intra-subdivision-area movement time (the second side intra-subdivision-area movement time according to the first subdivision area Aa1). The same applies to the second to fourth subdivision areas Aa2 to Aa4.

Inn step S306, the control section 51 calculates the intra-subdivision-area movement time ratio by performing essentially the same process as step S208 (the intra-subdivision-area movement time ratio calculation step). The control section 51 calculates the proportions of the first side and second side intra-subdivision-area movement times which are calculated by step S304 (the intra-subdivision-area movement time calculation step) in relation to the first and second production times which are each calculated by step S204 (the production time calculation step) as the first side and second side intra-subdivision-area movement time ratios, respectively, which are probabilities of the first and second sides.

In step S308, the control section 51 calculates the second interference loss time by performing essentially the same process as step S210 (a second interference loss time calculation step). The control section 51 calculates a value obtained by multiplying the intra-subdivision-area movement time of one of the first and second mounting heads 33a and 33b which is calculated by step S304 (the intra-subdivision-area movement time calculation step) by the intra-subdivision-area movement time ratio of the other of the first and second mounting heads 33a and 33b which is calculated by step S306 (the intra-subdivision-area movement time ratio calculation step) as the interference loss time for each of the subdivision areas Aa1 to Aa4. The second interference loss times are the interference loss times for each of the subdivision areas Aa1 to Aa4.

In step S310, the control section 51 calculates the third interference loss time (a third interference loss time calculation step). The control section 51 calculates a largest of totals of both of the interference loss times (the second interference loss times) of the first and second mounting heads 33a and 33b which are calculated for each of the subdivision areas Aa1 to Aa4 by step S308 (the second interference loss time calculation step) as the interference loss time of the subdivision area corresponding to the total.

For example, as illustrated in FIG. 14, both interference loss times of the first and second mounting heads 33a and 33b and the total of both interference loss times are illustrated for each of the subdivision areas Aa1 to Aa4. Since the largest of the totals of both of the interference loss times (6 seconds) corresponds to the fourth subdivision area Aa4, the interference loss time of the fourth subdivision area Aa4 is calculated as 6 seconds.

In step S312, the control section 51 calculates the fourth interference loss time (a fourth interference loss time calculation step). The control section 51 repeats a process of calculating, when the subdivision areas for which the interference loss time is not calculated remain after excluding the subdivision area corresponding to the interference loss time which is calculated by step S310 (the third interference loss time calculation step), a largest of totals of both of the interference loss times of the first and second mounting heads 33a and 33b which are calculated for each of the remaining subdivision areas as an interference loss time of the subdivision area corresponding to the total.

For example, as illustrated in FIG. 15, both interference loss times of the first and second mounting heads 33a and 33b and the total of both interference loss times are illustrated for each subdivision area Aa1 to Aa3 except for the fourth subdivision area Aa4 for which the interference loss time is already calculated. Since the largest of the totals of both of the interference loss times (4 seconds) corresponds to the first subdivision area Aa1, the interference loss time of the first subdivision area Aa1 is calculated as 4 seconds.

Note that, at this time, the movement time of the remaining subdivision areas over the fourth subdivision area Aa4 for which the interference loss time is already calculated is not included in the intra-subdivision-area time. The interference loss time is calculated in the same manner for the remaining subdivision areas. The control section 51 calculates the interference loss time of the interference area Aa by obtaining the total of the interference loss times which are calculated for each of the subdivision areas.

According to the embodiment described earlier, step S104 (the interference loss time calculation step) includes step S202 (an interference area calculation step) of calculating the interference area Aa, step S302 (a subdivision area calculation step) of calculating a plurality of subdivision areas Aa1 to Aa4 by further subdividing the interference area Aa which is calculated by step S202 (the interference area calculation step), step S204 (a production time calculation step) of calculating both first and second production times which are time taken to mount all of the electronic components to be mounted to the first and second substrates S1 and S2, respectively, step S304 (an intra-subdivision-area movement time calculation step) of calculating, when the first and second mounting heads 33a and 33b pass through the subdivision areas which are calculated by step S302 (the subdivision area calculation step) during the mounting of all of the respective electronic components, the movement times of the first and second mounting heads 33a and 33b in this case as first side and second side intra-subdivision-area movement times, respectively, step S306 (an intra-subdivision-area movement time ratio calculation step) of calculating proportions of the first side and second side intra-subdivision-area movement times which are calculated by step S304 (the intra-subdivision-area movement time calculation step) in relation to the first and second production times which are each calculated by step S204 (the production time calculation step) as the first side and second side intra-subdivision-area movement time ratios, respectively, which are probabilities of the first and second sides, step S308 (a second interference loss time calculation step) of calculating a value obtained by multiplying the intra-subdivision-area movement time of one of the first and second mounting heads 33a and 33b which is calculated by step S304 (the intra-subdivision-area movement time calculation step) by the intra-subdivision-area movement time ratio of the other of the first and second mounting heads 33a and 33b which is calculated by step S306 (the intra-subdivision-area movement time ratio calculation step) as the interference loss time for each of the subdivision areas, and step S310 (a third interference loss time calculation step) of calculating a largest of totals of both of the interference loss times of the first and second mounting heads 33a and 33b which are calculated for each of the subdivision areas by step S308 (the second interference loss time calculation step) as the interference loss time of the subdivision area corresponding to the total. Accordingly, it is possible to more accurately and reliably calculate the interference loss time by subdividing the interference area Aa, and thus, it is possible to more accurately and reliably determine the substrate stopping positions of the first and second substrates S1 and S2. In other words, it is possible to calculate the interference loss time with higher reliability for the interference area Aa.

Step S104 (the interference loss time calculation step) further includes step S312 (a fourth interference loss time calculation step) of repeating a process of calculating, when the subdivision areas for which the interference loss time is not calculated remain after excluding the subdivision area corresponding to the interference loss time which is calculated by step S310 (the third interference loss time calculation step), a largest of totals of both of the interference loss times of the first and second mounting heads 33a and 33b which are calculated for each of the remaining subdivision areas as an interference loss time of the subdivision area corresponding to the total. Accordingly, it is possible to more accurately and reliably calculate the interference loss time for each subdivision area when subdividing the interference area Aa, and thus, it is possible to more accurately and reliably determine the substrate stopping positions of the first and second substrates S1 and S2.

REFERENCE SIGNS LIST

10 . . . mounting line, 11 . . . substrate supplying device, 12 . . . printing device, 13 . . . shift device, 13a . . . control device, 14, 15, 20 . . . electronic component mounting machine, 14a, 15a . . . control section, 16 . . . shift device, 16a . . . control device, 17 . . . reflow device, 18 . . . substrate storage device, 20a . . . control section, 21 . . . base, 25 . . . substrate conveyance device, 26, 27 . . . substrate conveyance lane, 28 . . . back-up device, 29a, 29b . . . component supply device, 30a, 30b . . . component transfer device, 33a, 33b . . . first and second mounting heads, 36a, 36b . . . suction nozzle, 43 . . . cassette feeder (component supply unit), 45a, 45b . . . imaging devices, host computer (substrate stopping position determination device), 51 . . . control section (movement time calculation section (movement time calculation step), interference loss time calculation section (interference loss time calculation step), stopping position determination section (stopping position determination step)), Aa interference area, Aa1 to Aa4 . . . subdivision area, Ab, Ac . . . occupation area, P1a, P1b, P1c . . . first side set position, P2a, P2b, P2c . . . second side set position, S1, S2 . . . substrate

The invention claimed is:

1. A substrate stopping position determination method of a component mounting machine which, in order to transport first and second substrates along a conveyance direction and mount electronic components on each, is provided with first and second substrate conveyance lanes which cause the first and second substrates to stop at each set position among a plurality of first and second side set positions which are set along the conveyance direction, the method comprising:

for each combination of one of the first side set positions and one of the second side set positions:
calculating respective movement times in which first and second mounting heads move respectively in order to mount the electronic components when the first substrate is positioned in one set position of the first side and the second substrate is positioned in one set position of the second side;
calculating a waiting time which is a time in which, while one of the first and second mounting heads enters an interference area, the other waits to enter the interference area as an interference loss time based on a probability that, when one of the first and second mounting heads is anticipated to enter the interference area, the other is moving within the interference area, and based on the movement time in an interference area in which there is a likelihood that the first and second mounting heads which correspond to the respective first and second substrates which are each positioned in the same set positions will interfere with each other; and determining the first side set position and the second side set position which are selected from among all combinations as substrate stopping positions based on total movement times which are calculated for all of the combinations of the first side set position and the second side set position and the interference loss time;

mounting the electronic components of a first component supply device on the first substrate, the first substrate being positioned at the first side set position; and mounting the electronic components of a second component supply device on the second substrate, the second substrate being positioned at the second side set position.

2. The substrate stopping position determination method according to claim 1, the method further comprising:

determining, as substrate stopping positions, the first side set position and the second side set position for which a total of the total movement time which is calculated for all of the combinations of the first side set position and the second side set position and the interference loss time is the smallest.

3. The substrate stopping position determination method according to claim 1, the method further comprising:

calculating the interference area;

calculating both first and second production times which are time taken to mount all of the electronic components to be mounted to the first and second substrates, respectively, calculating, when the first and second mounting heads pass through the interference area during the mounting of all of the respective electronic components, the movement times of the first and second mounting heads in this case as first and second intra-interference-area movement times, respectively;

calculating proportions of the first and second intra-interference-area movement times in relation to the first and second production times as the first and second intra-interference-area movement time ratios, respectively, which are probabilities of the first and second sides; and calculating a value obtained by multiplying the intra-interference-area movement time of one of the first and second mounting heads by the intra-interference-area movement time ratio of the other of the first and second mounting heads as the interference loss time.

4. The substrate stopping position determination method according to claim 1, the method further comprising:

calculating the interference area;

calculating a plurality of subdivision areas by further subdividing the interference area;

calculating both first and second production times which are time taken to mount all of the electronic components to be mounted to the first and second substrates, respectively, calculating, when the first and second mounting heads pass through the subdivision areas during the mounting of all of the respective electronic components, the movement times of the first and second mounting heads in this case as first side and second side intra-subdivision-area movement times, respectively;

calculating proportions of the first side and second side intra-subdivision-area movement times in relation to the first and second production times as the first side and second side intra-subdivision-area movement time ratios, respectively, which are probabilities of the first and second sides;

calculating a value obtained by multiplying the intra-subdivision-area movement time of one of the first and second mounting heads by the intra-subdivision-area movement time ratio of the other of the first and second mounting heads as the interference loss time for each of the subdivision areas; and calculating a largest of totals of both of the interference loss times of the first and second mounting heads which are calculated for each of the subdivision areas as the interference loss time of the subdivision area corresponding to the total.

5. The substrate stopping position determination method according to claim 4, the method further comprising:

repeating a process of calculating, when the subdivision areas for which the interference loss time is not calculated remain after excluding the subdivision area corresponding to the interference loss time, a largest of totals of both of the interference loss times of the first and second mounting heads which are calculated for each of the remaining subdivision areas as an interference loss time of the subdivision area corresponding to the total.

6. A substrate stopping position determination device of a component mounting machine which, in order to transport first and second substrates along a conveyance direction and mount electronic components on each, is provided with first and second substrate conveyance lanes which cause the first and second substrates to stop at each set position among a plurality of first and second side set positions which are set along the conveyance direction, the substrate stopping position determination device comprising:

circuitry configured to:

for each combination of one of the first side set positions and one of the second side set positions:

calculate respective movement times in which first and second mounting heads move respectively in order to mount the electronic components when the first substrate is positioned in one set position of the first side and the second substrate is positioned in one set position of the second side;

calculate a waiting time which is a time in which, while one of the first and second mounting heads enters an interference area, the other waits to enter the interference area as an interference loss time based on a probability that, when one of the first and second mounting heads is anticipated to enter the interference area, the other is moving within the interference area, and based on the movement time in an interference area in which there is a likelihood that the first and second mounting heads which correspond to the respective first and second substrates which are each positioned in the same set positions will interfere with each other; and determine the first side set position and the second side set position which are selected from among all combinations as substrate stopping positions based on total movement times and the interference loss time for all of the combinations of the first side set position and the second side set position;

mount the electronic components of a first component supply device on the first substrate, the first substrate being positioned at the first side set position; and mount the electronic components of a second component supply device on the second substrate, the second substrate being positioned at the second side set position.

7. The substrate stopping position determination method according to claim 1, wherein the interference loss time is based on a positional relationship between the first substrate and the second substrate.

8. The substrate stopping position determination method according to claim 7, wherein the interference loss time increases when a distance between the first substrate and the second substrate decreases.

* * * * *